United States Patent
Nagai et al.

(10) Patent No.: US 6,844,246 B2
(45) Date of Patent: Jan. 18, 2005

(54) PRODUCTION METHOD OF III NITRIDE COMPOUND SEMICONDUCTOR, AND III NITRIDE COMPOUND SEMICONDUCTOR ELEMENT BASED ON IT

(75) Inventors: Seiji Nagai, Aichi (JP); Kazuyoshi Tomita, Aichi (JP); Masahito Kodama, Aichi (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 0 days.

(21) Appl. No.: 10/472,261

(22) PCT Filed: Mar. 19, 2002

(86) PCT No.: PCT/JP02/02628

§ 371 (c)(1),
(2), (4) Date: Nov. 5, 2003

(87) PCT Pub. No.: WO02/080243

PCT Pub. Date: Oct. 10, 2002

(65) Prior Publication Data

US 2004/0087115 A1 May 6, 2004

(30) Foreign Application Priority Data

Mar. 22, 2001 (JP) ........................................ 2001-083490

(51) Int. Cl.$^7$ ............................................... H01L 21/20
(52) U.S. Cl. ........................... 438/479; 438/438; 438/44
(58) Field of Search ..................... 438/21–47, 479–507

(56) References Cited

U.S. PATENT DOCUMENTS

| | | | |
|---|---|---|---|
| 5,185,290 A | 2/1993 | Aoyagi et al. | |
| 5,798,536 A | 8/1998 | Tsutsui | |
| 6,051,849 A | 4/2000 | Davis et al. | |
| 6,110,277 A | 8/2000 | Braun | |
| 6,121,121 A | 9/2000 | Koide | |
| 6,146,457 A | 11/2000 | Solomon | |
| 6,177,688 B1 | 1/2001 | Linthicum et al. | |
| 6,255,198 B1 | 7/2001 | Linthicum et al. | |
| 6,261,929 B1 | 7/2001 | Gehrke et al. | |
| 6,265,289 B1 | 7/2001 | Zheleva et al. | |

(List continued on next page.)

FOREIGN PATENT DOCUMENTS

| | | |
|---|---|---|
| EP | 0 551 721 A2 | 7/1993 |
| EP | 0 779 666 A3 | 6/1997 |

(List continued on next page.)

OTHER PUBLICATIONS

Nam et al., "Lateral epitaxy of low defect density GaN layers via organometallic vapor phase epitaxy", pp. 2638–2640, Appl. Phys. Ltett. 71 (18), Nov. 3, 1997.

(List continued on next page.)

*Primary Examiner*—Savitri Mulpuri
(74) *Attorney, Agent, or Firm*—McGinn & Gibb, PLLC

(57) ABSTRACT

A GaN layer 32 grows in vertical direction on a GaN layer 31 where neither a first mask 41*m* nor a second mask 42*m* is formed. When thickness of the GaN layer 32 becomes larger than that of the first mask 41*m*, it began to grown in lateral direction so as to cover the first mask 41*m*. Because the second mask 42*m* is not formed on the upper portion of the first mask 41*m*, the GaN layer 32 grows in vertical direction. On the contrary, at the upper region of the GaN layer 31 where the mask 41*m* is not formed, the second mask 42*m* is formed like eaves, the growth of the GaN layer 32 stops and threading dislocations propagated with vertical growth also stops there. The GaN layer 32 grows in vertical direction so as to penetrate the region where neither the first mask 41*m* nor the second mask 42*m* is formed. When the height of the GaN layer 32 becomes larger than that of the second mask 42*m*, the GaN layer 32 begins to grow in lateral direction again and covers the second mask 42*m*. After the GaN layer 32 completely covers the second mask 42*m*, it began to grow in vertical direction.

13 Claims, 5 Drawing Sheets

U.S. PATENT DOCUMENTS

| | | |
|---|---|---|
| 6,274,518 B1 | 8/2001 | Yuri et al. |
| 6,319,742 B1 | 11/2001 | Hayashi et al. |
| 6,329,667 B1 | 12/2001 | Ota et al. |
| 6,355,497 B1 | 3/2002 | Romano et al. |
| 6,365,921 B1 | 4/2002 | Watanabe et al. |
| 6,498,048 B2 * | 12/2002 | Morita .................. 438/22 |
| 6,627,520 B2 * | 9/2003 | Kozaki et al. ............ 438/479 |

FOREIGN PATENT DOCUMENTS

| | | |
|---|---|---|
| EP | 0 951 055 A2 | 10/1999 |
| EP | 0 993 048 A2 | 4/2000 |
| EP | 1 045 431 A1 | 10/2000 |
| EP | 1 059 661 A2 | 12/2000 |
| EP | 1 059 677 A2 | 12/2000 |
| EP | 1278233 * | 1/2003 |
| JP | 49-149679 | 4/1973 |
| JP | 48-95181 | 12/1973 |
| JP | 51-137393 | 11/1976 |
| JP | 55-34646 | 8/1978 |
| JP | 57-115849 | 7/1982 |
| JP | 58-33882 | 2/1983 |
| JP | 1-316459 | 12/1989 |
| JP | 3-133182 | 6/1991 |
| JP | 4-10665 | 1/1992 |
| JP | 4-84418 | 3/1992 |
| JP | 04-303920 | 10/1992 |
| JP | 5-41536 | 2/1993 |
| JP | 5-110206 | 4/1993 |
| JP | 05-283744 | 10/1993 |
| JP | 5-343741 | 12/1993 |
| JP | 6-196757 | 7/1994 |
| JP | 7-249830 | 9/1995 |
| JP | 7-273367 | 10/1995 |
| JP | 8-64791 | 3/1996 |
| JP | 8-102549 | 4/1996 |
| JP | 08-116090 | 5/1996 |
| JP | 8-222812 | 8/1996 |
| JP | 08-274411 | 10/1996 |
| JP | 09-162125 | 6/1997 |
| JP | 10-312971 | 11/1998 |
| JP | 10-321954 | 12/1998 |
| JP | 11-31864 | 2/1999 |
| JP | 11-043398 | 2/1999 |
| JP | 11-135770 | 5/1999 |
| JP | 11-135832 | 5/1999 |
| JP | 11-145516 | 5/1999 |
| JP | 11-145519 | 5/1999 |
| JP | 11-191533 | 7/1999 |
| JP | 11-191657 | 7/1999 |
| JP | 11-191659 | 7/1999 |
| JP | 11-219910 | 8/1999 |
| JP | 11-251632 | 9/1999 |
| JP | 11-260737 | 9/1999 |
| JP | 11-274082 | 10/1999 |
| JP | 11-312825 | 11/1999 |
| JP | 11-329971 | 11/1999 |
| JP | 11-330546 | 11/1999 |
| JP | 11-340508 | 12/1999 |
| JP | 2000-21789 | 1/2000 |
| JP | 2000-44121 | 2/2000 |
| JP | 2000-91253 | 3/2000 |
| JP | 2000-106455 | 4/2000 |
| JP | 2000-106473 | 4/2000 |
| JP | 2000-124500 | 4/2000 |
| JP | 2000-150959 | 5/2000 |
| JP | 2000-174393 | 6/2000 |
| JP | 2000-232239 | 8/2000 |
| JP | 2000-244061 | 9/2000 |
| JP | 2000-261106 | 9/2000 |
| JP | 2000-277437 | 10/2000 |
| JP | 2000-299497 | 10/2000 |
| JP | 2000-357663 | 12/2000 |
| JP | 2000-357843 | 12/2000 |
| JP | 2001-60719 | 3/2001 |
| JP | 2001-93837 | 4/2001 |
| JP | 2001-111174 | 4/2001 |
| JP | 2001-122693 | 5/2001 |
| JP | 2001-176813 | 6/2001 |
| JP | 2001-257193 | 9/2001 |
| WO | WO 97/11518 | 3/1997 |
| WO | WO 98/47170 | 10/1998 |
| WO | WO 99/01594 | 1/1999 |
| WO | WO 00/04615 | 1/2000 |
| WO | WO 00/55893 | 9/2000 |
| WO | WO 02/058120 A1 | 7/2002 |

OTHER PUBLICATIONS

Hiramatsu et al., "Selective area growth and epitaxial lateral overgrowth of GaN by metalorganic vapor phase epitaxy and hydride vapor phase epitaxy", pp. 104–111, Materials Science and Engineering B59 (1999).

Akasaki et al., "Effects of AlN Buffer Layer on Crystallographic Structure and on Electrical and Optical Properties f GaN and Ga1–xAlxN . . . Movpe" pp. 209–219, Journal of Crystal Growth 98 (1989) North–Holland, Amsterdam.

Yang et al., "High quality GaN–InGaN heterostructures grown on (111) silicon substrates", pp. 3566–3568. Appl. Phys. Lett. 69 (23), Dec. 2, 1996.

Wolf et al, "Silicon Processing for the VLSI Era," vol. 1, Lattice Press, 1986, pg. 5.

Luther et al., "Titanium and titanium nitride contacts to n–type gallium nitride", Semicond. Sci. Technol. 13 (1998) pp.1322–1327.

Dimitriadis et al., "Contacts of titanium nitride to —and p–type gallium nitride films", Solid–State Electronics 43 (1999), pp. 1969–1972.

Zheleva et al., "Pendeo–Epitary–A New Approach for Lateral Growth of Galium Nitride Structures", MRS Internet J. Nitride Senicond. Res. 4SI, G3.38 (1999), 6 pages total.

Uchida et al., "AlGaInN based Laser Diodes", In–Plans Semiconductor Lasers IV, III–Vs Review vol. 13, No. 3, May/Jun. 2000, pp. 156–164.

Zheleva et al., Pendeo–Epitary versus Lateral Epitaxial Overgrowth of GaN: A Comparative Study via Finite element Analysis, Journal f electronic Materials, vol. 28, No. 4, Apr. 1999, pp. 545–551.

Zheleva et al., "Pendeo–Epitaxy: A New Approach for Lateral Growth of Gallium Nitride Films", Journal of Electr nic Materials, vol. 28, No. 4, 1999, pp. L5–L8.

D. Kapolnek, et al. Anisotropic epitaxial lateral growth in GaN Selective area epitaxy, Appl. Phys. Lett. 71 Sep. 1, 1997, pp. 1204–1206.

Hidetada Matsushima, et al., "Selective growth of GaN on submicron pattern by MOVPE", The Institute of Electronics, pp. 41–46.

Yoshinori Ujiie, et al., "Epitaxial Lateral Overgrowth of GaAs on a Si Sustrate", Appl. Phys. vol. 28, No. 3, Mar. 1989, pp. L337–L339.

PCT Form 210 (PCT/JP02/05446).
PCT Form 210 (PCT/JP02/02628).
PCT Form 210 (PCT/JP02/01159).
PCT Form 210 (PCT/JP01/01928).
PCT Form 210 (PCT/JP01/02695).
PCT Form 210 (PCT/JP00/09120).
PCT Form 210 (PCT/JP01/01396).

PCT Form 210 (PCT/JP01/00178).
PCT Form 210 (PCT/JP01/01663).
PCT Form 210 (PCT/JP00/09121).
PCT Form 210 (PCT/JP00/09220).
PCT Form 338 and 409 (IPER) (PCT/JP01/02695).
PCT Form 338 and 409 (IPER) (PCT/JP01/01663) and translation thereof.
PCT Form 338 and 409 (IPER) (PCT/JP00/09120) and translation thereof.
PCT Form 338 and 409 (PCT/JP01/01928) and translation thereof.
PCT Form 338 and 409 (PCT/JP01/01396) and translation thereof.
Search Report (EP 27057) dated Jul. 18, 2000.
Search Report (EP 27279) dated Feb. 15, 2002.
Ishikawa, et al., "MOCVD growth of GaN on Si substrate" pp. 191–196.

Tanaka, et al., "TEM observation of selective area growth GaN pyramid on (111)Si" pp. 197–202.

Dadgar, et al., "Metalorganic Chemical Vapor Phase Epitaxy of Crack–Free GaN on Si(111) Exceeding 1 um in Thickness" J. Appl. Phys. vol. 39 (2000) Pt. 2 No. 11B, pp.L1185.

Sato, et al., "A New Substrate Engineering for the Formation of Empty Space in Silicon (ESS) Induced by Silicon by Silicon Surface Migration" IEEE IEDM pp. 99–517–520.

Ishikawa, et al. "GaN on Si Substrate with AIGaN/AIN Intermediate Layer" Jpm.J.Appl. Phys. vol.38 (1999) pp. L492–494 Part 2, No. 5A, May 1, 1999.

Eleckam, et al., "Dislocation–free InSb grown on GaAs compliant universal substrates" Appl.Phys.Lett. 71 (6), Aug. 11, 1997, pp. 776–778.

* cited by examiner

US 6,844,246 B2

PRODUCTION METHOD OF III NITRIDE COMPOUND SEMICONDUCTOR, AND III NITRIDE COMPOUND SEMICONDUCTOR ELEMENT BASED ON IT

TECHNICAL FIELD

The present invention relates to a method for fabricating Group III nitride compound semiconductors. More particularly, the present invention relates to a method for fabricating Group III nitride compound semiconductors employing epitaxial lateral overgrowth (ELO). The Group III nitride compound semiconductors are generally represented by $Al_xGa_yIn_{1-x-y}N$ (wherein $0 \leq x \leq 1$, $0 \leq y \leq 1$, and $0 \leq x+y \leq 1$), and examples thereof include binary semiconductors such as AlN, GaN, and InN; ternary semiconductors such as $Al_xGa_{1-x}N$, $Al_xIn_{1-x}N$, and $Ga_xIn_{1-x}N$ (wherein $0<x<1$); and quaternary semiconductors such as $Al_xGa_yIn_{1-x-y}N$ (wherein $0<x<1$, $0<y<1$, and $0<x+y<1$).

In the present specification, unless otherwise specified, "Group III nitride compound semiconductors" encompass Group III nitride compound semiconductors which are doped with an impurity so as to assume p-type or n-type conductivity.

BACKGROUND ART

Group III nitride compound semiconductor are direct-transition semiconductors exhibiting a wide range of emission spectra from UV to red light when used in an element such as a light-emitting device, and have been used in light-emitting devices such as light-emitting diodes (LEDs) and laser diodes (LDs). In addition, due to their broad band gaps, divices employing the aforementioned semiconductors are expected to exhibit reliable operational characteristics at high temperature as compared with those employing semiconductors of other types, and thus application thereof to transistors such as FETs has been energetically studied. Moreover, since Group III nitride compound semiconductors contain no arsenic (As) as a predominant element, application of Group III nitride compound semiconductors to various semiconductor devices has been longed for from the environmental aspect. Generally, these Group III nitride compound semiconductors are formed on a sapphire substrate.

However, when a Group III nitride compound semiconductor is formed on a sapphire substrate, misfit-induced dislocations occur due to difference between the lattice constant of sapphire and that of the semiconductor, resulting in poor device characteristics. Misfit-induced dislocations are threading dislocations which penetrate semiconductor layers in a longitudinal direction (i.e., in a direction vertical to the surface of the substrate), and Group III nitride compound semiconductors are accompanied by the problem that dislocations in amounts of approximately $10^9$ cm$^{-2}$ propagate therethrough. The aforementioned dislocations propagate through layers formed from Group III nitride compound semiconductors of different compositions, until they reach the uppermost layer. When such a semiconductor is incorporated in, for example, a light-emitting device, the device poses problems of unsatisfactory device characteristics in terms of threshold current of an LD, service life of an LED or LD, etc. On the other hand, when a Group III nitride compound semiconductor is incorporated in any of other types of semiconductor devices, because electrons are scattered due to defects in the Group III nitride compound semiconductor, the semiconductor device comes to have low mobility. These problems are not solved even when another type of substrate is employed.

The aforementioned dislocations will next be described with reference to a schematic representation shown in FIG. 6. FIG. 6 shows a substrate 91, a buffer layer 92 formed thereon, and a Group III nitride compound semiconductor layer 93 further formed thereon. Conventionally, the substrate 91 is formed of sapphire or a similar substance and the buffer layer 92 is formed of aluminum nitride (AlN) or a similar substance. The buffer layer 92 formed of aluminum nitride (AlN) is provided so as to relax misfit between the sapphire substrate 91 and the Group III nitride compound semiconductor layer 93. However, generation of dislocations is not reduced to zero. Threading dislocations 901 propagate upward (in a vertical direction with respect to the substrate surface) from dislocation initiating points 900, penetrating the buffer layer 92 and the Group III nitride compound semiconductor layer 93. When a semiconductor device is fabricated by depositing various types of Group III nitride compound semiconductors of interest on the Group III nitride compound semiconductor layer 93, threading dislocations further propagate upward, through the semiconductor element, from dislocation arrival points 902 on the surface of the Group III nitride compound semiconductor layer 93. Thus, according to conventional techniques, problematic propagation of dislocations cannot be prevented during formation of Group III nitride compound semiconductor layers.

In recent years, in order to prevent propagation of the threading dislocations, techniques employing lateral growth of crystal have been developed. According to the techniques, a mask partially provided with an array of slits, which is formed from a material such as silicon oxide or tungsten, is provided on a sapphire substrate or a Group III nitride compound semiconductor layer, and crystal growth is elicited to proceed laterally on the mask, with the slits serving as a seed. Threading dislocations, however, propagate upside on the upper portion of the window part. In order to prevent threading dislocations from propagating on the window part, the upper portion of the mask should be covered through lateral growth, and further a second mask should be formed in stripe pattern on the upper portion of the window on which the mask is not formed and then the lateral growth is executed on the mask again. In short, three times of forming a Group III nitride compound semiconductor process and two times of mask forming process, each of which is a completely different process, needed to be carried out.

DISCLOSURE OF THE PRESENT INVENTION

The present invention has been accomplished in an attempt to solve the aforementioned problems, and an object of the present invention is to fabricate a Group III nitride compound semiconductor with suppressed threading dislocations with decreasing times of changing processes.

In order to overcome the above-described drawbacks, the followings may be useful.

The invention drawn to a first feature provides a method for fabricating a Group III nitride compound semiconductor which forms a Group III nitride compound semiconductor layer with suppressed threading dislocations through lateral epitaxial growth, comprising steps of: a first mask forming process in which a first mask, on which a Group III nitride compound semiconductor does not grow epitaxially, is formed in an island-like pattern having a shape of, for example, dot, stripe, or grid, on a layer which serves as an underlying layer; a growth space ensuring process in which a growth space ensuring material is formed in order to ensure a growth space for growing the Group III nitride compound semiconductor epitaxially; a process of forming a second mask on which the Group III nitride compound semiconductor does not grow epitaxially; a process of removing the growth space ensuring material formed in the growth space ensuring process; and an epitaxial growth process in which the Group III nitride compound semiconductor is formed in the growth space through vertical and lateral epitaxial growth, wherein the masks are formed so that the entire surface of the underlying layer is covered by the first mask and the second mask when the underlying layer is seen in a vertical direction from its top. In the present specification, the term "underlying layer" is used to collectively encompass the followings: (1) a single or complex substrate regardless of its compositions; (2) a substrate on which a buffer layer is formed regardless of its compositions; and (3) a substrate on which a buffer layer is formed or not formed and a Group III nitride compound semiconductor layer is formed thereon. The expression "island-like structure" does not necessarily refer to regions separated from one another. The upper portions of the mask 1 may be continuously connected to one another over a considerably wide area, and such a structure may be obtained by forming the entirety of the mask on a wafer into stripes or grids.

The invention drawn to a second feature provides a method for fabricating a Group III nitride compound semiconductor, in which the second mask forming process comprises the steps of: a process in which a portion of the growth space ensuring material formed in the growth space ensuring process is removed and at least one of a portion of the first mask and a portion of the underlying layer is exposed; a process in which materials for forming the second mask is formed on the entire surface of the growth space ensuring material so that the second mask is connected to at least one of the exposed surface of the first mask and the exposed surface of the underlying layer; and a process in which a portion of the second mask material is removed and a portion of the growth space ensuring material, which is formed in the growth space existing at a region comprising the first mask at a lower portion thereof, is exposed.

The invention drawn to a third feature provides a method for fabricating a Group III nitride compound semiconductor, wherein the uppermost layer in the underlying layer and the Group III nitride compound semiconductor have the same composition. As used herein, the term "same composition" does not exclude differences in a doping level (differences of less than 1 mol %). And the third feature does not exclude the case in which the underlying layer is a single Group III nitride compound semiconductor substrate.

The invention drawn to a fourth feature provides a Group III nitride compound semiconductor device, which is formed on the Group III nitride compound semiconductor layer produced through a method for fabricating a Group III nitride compound semiconductor as recited in connection with any one of the first to third features.

The invention drawn to a fifth feature provides a Group III nitride compound semiconductor light-emitting device, which is produced by depositing a Group III nitride compound semiconductor layer with a different composition on a Group III nitride compound semiconductor layer produced through a method for fabricating a Group III nitride compound semiconductor as recited in connection with any one of the first to third features.

The invention drawn to a sixth feature provides a method for fabricating a Group III nitride compound semiconductor substrate, which comprises a method for fabricating a Group III nitride compound semiconductor as recited in connection with any one of the first to third features, and removing substantially entire downward portions from the second mask.

The outline of the method for fabricating a Group III nitride compound semiconductor of the present invention will next be described with reference to FIGS. 1A–1H. Although FIGS. 1A–1H illustrate layers accompanied by a substrate 1 and a buffer layer 2 so as to facilitate understanding of the description, the substrate 1 and the buffer layer 2 are not essential elements of the present invention, in view that the present invention is to produce, by employment of an underlying layer which may generate a Group III nitride compound semiconductor having threading dislocations in the vertical direction if it is grown epitaxially and a Group III nitride compound semiconductor which is to formed through epitaxial growth, the Group III nitride compound semiconductor layer including a region in which threading dislocations in the vertical direction are reduced. The gist of the operation and effects of the present invention will next be described with reference to an embodiment in which a first Group III nitride compound semiconductor layer 31 having threading dislocations in the vertical direction (direction vertical to the substrate surface) is provided on the substrate 1 via the buffer layer 2. In this case, an underlying layer may be only a first Group III nitride compound semiconductor layer 31, or may alternatively comprise the substrate 1, the buffer layer 2 and the Group III nitride compound semiconductor layer 31.

A first mask material 41 was formed on the entire surface of a first Group III nitride compound semiconductor layer 31 having threading dislocations in vertical direction (direction vertical to the substrate surface) provided on the substrate 1 (FIG. 1A). The mask material 41 is subjected to etching, so as to form an island-like structure having a shape of, for example, dot, stripe, or grid, thereby providing a first mask 41m. As a result, the surface of the first Group III nitride compound semiconductor layer 31 is exposed in scattered manner (FIG. 1B, a first mask forming process).

A growth space ensuring material 5 was formed so as to cover the first mask 41m formed in island-like structure and the exposed surface of the first Group III nitride compound semiconductor layer 31 existing in scattered manner (FIG. 1C). An insulator, a dielectric, a single-element such as a metal, an alloy, and a compound including a mixture may be employed as the growth space ensuring material. Subsequently, the growth space ensuring material 5 was subjected to etching, to thereby obtain a growth space for growing a second Group III nitride compound semiconductor epitaxially. A portion of the shaped growth space ensuring material 5s is contacted to the Group III nitride compound semiconductor layer 31 (FIG. 1D, a growth space ensuring process).

A second mask material 42 is formed on the entire surface of the wafer (FIG. 1E). The second mask material 42 is formed to cover the shaped growth space ensuring material 5s. Then the second mask material 42 was shaped in an objective pattern through a treatment such as etching. Here almost all of the Group III nitride compound semiconductor 31 is covered by the first mask 41m and the second mask 42m when it is seen in the vertical direction from atop (FIG. 1F). When the first mask 41m was formed in an island-like pattern existing in scattered manner, for example, the second mask 42m may be formed in grid or mesh pattern, and when the first mask 41m was formed in stripe pattern, the second mask 42m may be formed in stripe pattern on the region where the first mask 41m was not formed. The second mask 42m has a "limb" so that it can be arranged at higher portion than the first mask 41m. The second mask 42m includes the "limb" hereinafter.

And the shaped growth space ensuring material 5s is removed through wet etching. Then a portion of the first Group III nitride compound semiconductor layer 31 contacted to the shaped growth space ensuring material 5s is exposed and a growth space which is formed in crooked shape and is surrounded by the first mask 41m and the second mask 42m is obtained. In this case, "crooked" is used to collectively encompass the case that almost all of the Group III nitride compound semiconductor 31 is covered in a top view by the first mask 41m and the second mask 42m and that a portion of the first Group III nitride compound semiconductor layer 31 is exposed under the second mask 42m and a space at which a Group III nitride compound semiconductor can be formed through epitaxial growth in vertical direction at the region above the first mask 41m is provided. In short, vertical epitaxial growth from the exposed surface of the first Group III nitride compound semiconductor layer 31 can be carried out at the region where the first mask 41m is not formed, but the vertical epitaxial growth may be stopped by the second mask 42m. Then lateral epitaxial growth can be carried out at the region below the second mask 42m to the upper portion of the first mask 41m, and vertical epitaxial growth can be carried out at the region above the first mask 41m where the second mask 42m is not formed. At the upper portion of the second mask 42m, the Group III nitride compound semiconductor layer can grow epitaxially in lateral direction from the part growing epitaxially in vertical direction on the area not covered with the second mask 43m (FIG. 1G).

By such process when the second Group III nitride compound semiconductor layer 32 is formed through vertical and lateral epitaxial growth, threading dislocations which penetrates along with vertical epitaxial growth from the exposed surface of the first Group III nitride compound semiconductor layer 31 on which the first mask 41m is not deposited are prevented from penetrating at the second mask 42m. The lateral epitaxial growth causing no threading dislocations enables the second Group III nitride compound semiconductor layer 32 to cover the first mask 41m, and the second Group III nitride compound semiconductor can be grown epitaxially in vertical direction on the region which the second mask 42m is not formed at the upper portion. Successively, when the second Group III nitride compound semiconductor layer 32 grows epitaxially in vertical direction to the level higher than the second mask 42m, the Group III nitride compound semiconductor layer 32 begins to grow epitaxially in lateral direction so as to cover the entire top surface of the mask 42m (FIG. 1H). At this time, threading dislocations except for a small part which are propagated obliquely are not propagated to the upper region represented by G in FIG. 1H owing to the two masks, to thereby obtain a Group III nitride compound semiconductor layer G having excellent quality and extremely little threading dislocations.

As described above, in the present invention, two necessary masks are formed and an unique growth of Group III nitride compound semiconductor is carried out in the two steps. Accordingly, a Group III nitride compound semiconductor with generation of threading dislocations suppressed can be fabricated in two steps (first feature).

In a process of forming the second mask, a portion of the growth space ensuring material 5 formed in the growth space ensuring process, e.g., a compound, is removed, at least one of a portion of the first mask 41m and a portion of the first Group III nitride compound semiconductor 31 is exposed as shown in FIG. 1D and the second mask material 42 is formed on the entire surface, the limb of the second mask 42m may be easily obtained (second feature).

When the first Group III nitride compound semiconductor has the same compositions as those of the second Group III nitride compound, their lattice constants and other physical quantity correspond with each other, which enables to obtain faster epitaxial growth between the two layers (third feature).

By forming a device on the Group III nitride compound semiconductor layer obtained in the above mentioned process, a semiconductor device comprising a layer with less defects and larger mobility can be obtained (fourth feature).

By forming a device on the Group III nitride compound semiconductor layer obtained in the above mentioned process, a light-emitting device with improved lifetime and threshold value can be obtained (fifth feature).

And by separating the Group III nitride compound semiconductor layers obtained in the above mentioned process formed on the second mask from other layers, a Group III nitride compound semiconductor with excellent crystallinity and remarkably suppressed crystal defects such as threading dislocations and can be obtained (sixth feature). In the present invention, "removing substantially entire downward portions" does not exclude the case that a portion of the threading dislocations remains for the sake of simplifying producing.

BEST MODE FOR CARRYING OUT THE INVENTION

Embodiments of the present invention will next be described with reference to the drawings. Characteristic features of the present invention have been described above are also the best mode for carrying out the invention, and the present invention is not limited to the below-described specific embodiments.

Figure 1A:
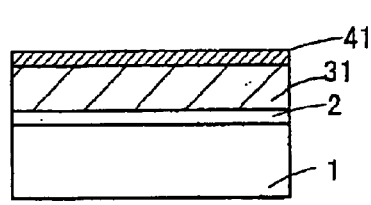
FIGS. 1A–1H are a series of cross-sectional views showing the steps of fabricating a Group III nitride compound semiconductor according to a first embodiment of the present invention.
Figure 1E:
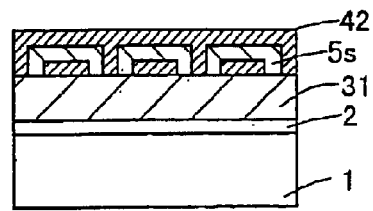
Figure 1B:
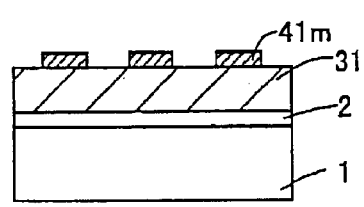
Figure 1F:
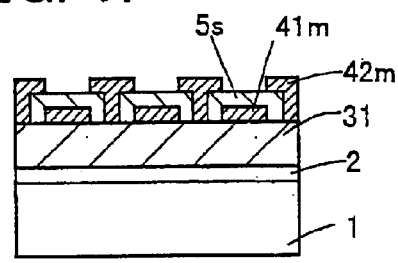
Figure 1C:
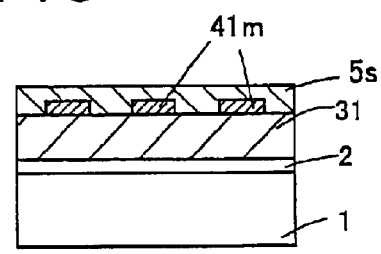
Figure 1G:
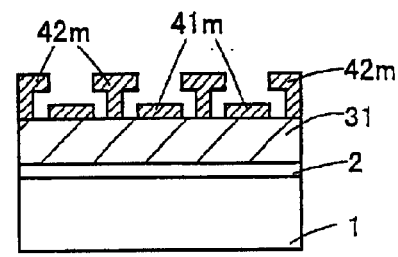
Figure 1D:
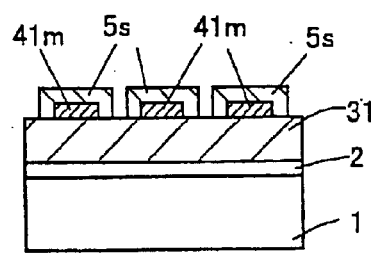

FIGS. 1A–1H schematically show a mode for carrying out a method for fabricating a Group III nitride compound semiconductor of the present invention. A buffer layer 2 and a first Group III nitride compound semiconductor layer 31 are formed on a substrate 1, and a first mask material 41 is formed on the entire surface (FIG. 1A). The first mask 41 is formed to be an island-like structure having a shape of, for example, dot, stripe, or grid, to thereby be a first mask 41m. At this time, the first Group III nitride compound semiconductor layer 31 is exposed in scattered manner (FIG. 1B). A growth space ensuring material 5 is formed so as to cover the first mask 41m formed in island-like structure and the exposed surface of the Group III nitride compound semiconductor layer 31 distributed in scattered manner (FIG. 1C). Then the growth space ensuring material 5 is shaped through etching in order to obtain a growth space to form a Group III nitride compound semiconductor through epitaxial growth. A portion of the shaped growth space ensuring material 5s is contacted to the Group III nitride compound semiconductor layer 31 (FIG. 1D).

A second mask material 42 is formed on the entire surface of the wafer (FIG. 1E) and shaped in an objective pattern through a treatment such as etching. Almost all of the Group III nitride compound semiconductor 31 is covered by the first mask 41m and the second mask 42m when it is seen from the top in the vertical direction (FIG. 1F). The second mask 42m has a "limb" so that it can be arranged at higher portion than the first mask 41m. And the shaped growth space ensuring material 5s is removed through wet etching. Then a portion of the first Group III nitride compound semiconductor layer 31 contacted to the shaped growth space ensuring material 5s is exposed and a growth space which is formed in a crooked shape and is surrounded by the first mask 41m and the second mask 42m is obtained (FIG. 1G). Next, a second Group III nitride compound semiconductor layer 32 is formed through vertical and lateral epitaxial growth. First, the Group III nitride compound semiconductor layer 32 is formed through epitaxial growth in vertical direction at the surface of the first Group III nitride compound semiconductor layer 31 on which the first mask 41m is not deposited. Next, the upper surface of the first mask 41m is covered through epitaxial growth in lateral direction. Then epitaxial growth in vertical direction is generated so as to penetrate the portion where the second mask 42m is not formed. The entire top surface of the second mask 42m is covered by the second Group III nitride compound semiconductor layer 32 through epitaxial growth in lateral direction generated at the upper portion higher than the second mask 42m.

The present invention can be carried out with reference to the following description.

When Group III nitride compound semiconductor layers are successively formed on a substrate, the substrate may be formed of an inorganic crystal compound such as sapphire, silicon (Si), silicon carbide (SiC), spinel ($MgAl_2O_4$), $NdGaO_3$, $LiGaO_2$, ZnO, or MgO; a Group III-V compound semiconductor such as gallium phosphide or gallium arsenide; or a Group III nitride compound semiconductor such as gallium nitride (GaN).

A preferred process for forming a Group III nitride compound semiconductor layer is metal-organic chemical vapor deposition (MOCVD) or metal-organic vapor phase epitaxy (MOVPE). However, molecular beam epitaxy (MBE), halide vapor phase epitaxy (halide VPE), liquid phase epitaxy (LPE), or the like may be used. Also, individual layers may be formed by different growth processes.

When a Group III nitride compound semiconductor layer is to be formed on, for example, a sapphire substrate, in order to impart good crystallinity to the layer, a buffer layer is preferably formed for the purpose of compensating the sapphire substrate for lattice mismatch. When a substrate of another material is to be used, employment of a buffer layer is also preferred. A buffer layer is preferably of a Group III nitride compound semiconductor $Al_xGa_yIn_{1-x-y}N$ formed at low temperature ($0 \leq x \leq 1$, $0 \leq y \leq 1$, $0 \leq x+y \leq 1$), more preferably of $Al_xGa_{1-x}N$ ($0 \leq x \leq 1$). This buffer layer may be a single layer or a multi-component layer comprising layers of different compositions. A buffer layer may be formed at a low temperature of 380 to 420° C. or by MOCVD at a temperature of 1,000 to 1,180° C. Alternatively, an AlN buffer layer can be formed by a reactive sputtering process using a DC magnetron sputtering apparatus and, as materials, high-purity metal aluminum and nitrogen gas. Similarly, a buffer layer represented by the formula $Al_xGa_yIn_{1-x-y}N$ ($0 \leq x \leq 1$, $0 \leq y \leq 1$, $0 \leq x+y \leq 1$, arbitrary composition) can be formed. Furthermore, vapor deposition, ion plating, laser abrasion, or ECR can be employed. When a buffer layer is to be formed by physical vapor deposition, physical vapor deposition is performed preferably at 200 to 600° C., more preferably 300 to 500° C., most preferably 350 to 450° C. When physical vapor deposition, such as sputtering, is employed, the thickness of a buffer layer is preferably 100 to 3,000 Å, more preferably 100 to 400 Å, most preferably 100 to 300 Å. A multi-component layer may contain, for example, alternating $Al_xGa_{1-x}N$ ($0 \leq x \leq 1$) layers and GaN layers. Alternatively, a multi-component layer may contain alternating layers of the same composition formed at a temperature of not higher than 600° C. and at a temperature of not lower than 1,000° C. Of course, these arrangements may be combined. Also, a multi-component layer may contain three or more different types of Group III nitride compound semiconductors $Al_xGa_yIn_{1-x-y}N$ ($0 \leq x \leq 1$, $0 \leq y \leq 1$, $0 \leq x+y \leq 1$). Generally, a buffer layer is amorphous and an intermediate layer is monocrystalline. Repetitions of unit of a buffer layer and an intermediate layer may be formed, and the number of repetitions is not particularly limited. The greater the number of repetitions, the greater the improvement in crystallinity.

The present invention is substantially applicable even when the composition of a buffer layer and that of a Group III nitride compound semiconductor formed on the buffer layer are such that a portion of Group III elements are replaced with boron (B) or thallium (Tl) or a portion of nitrogen (N) atoms are replaced with phosphorus (P), arsenic (As), antimony (Sb), or bismuth (Bi). Also, the buffer layer and the Group III nitride compound semiconductor may be doped with any one of these elements to such an extent as not to appear in the composition thereof. For example, a Group III nitride compound semiconductor which is represented by $Al_xGa_{1-x}N$ ($0 \leq x \leq 1$) and which does not contain indium (In) and arsenic (As) may be doped with indium (In), which is larger in atomic radius than aluminum (Al) and gallium (Ga), or arsenic (As), which is larger in atomic radius than nitrogen (N), to thereby improve crystallinity through compensation, by means of compression strain, for crystalline expansion strain induced by dropping off of nitrogen atoms. In this case, since acceptor impurities easily occupy the positions of Group III atoms, p-type crystals can be obtained as grown. Through the thus-attained improvement of crystallinity combined with the features of the present invention, threading dislocation can be further reduced to approximately $\frac{1}{100}$ to $\frac{1}{1,000}$. In the case of an underlying layer containing two or more repetitions of a buffer layer and a Group III nitride compound-semiconductor layer, the Group III nitride compound semiconductor layers are further preferably doped with an element having atomic radius greater than that of a predominant component element. In the case where a light-emitting element is a target product, use of a binary or ternary Group III nitride compound semiconductor is preferred.

When an n-type Group III nitride compound semiconductor layer is to be formed, a Group IV or Group VI element, such as Si, Ge, Se, Te, or C, can be added as an n-type impurity. A Group II or Group IV element, such as Zn, Mg, Be, Ca, Sr, or Ba, can be added as a p-type impurity. The same layer may be doped with a plurality of n-type or p-type impurities or doped with both n-type and p-type impurities.

Lateral epitaxial growth preferably progresses such that the front of lateral epitaxial growth is perpendicular to a substrate. However, lateral epitaxial growth may progress while slant facets with respect to the substrate are maintained. More preferably, in lateral epitaxial growth progresses, growth fronts are {11–20} planes of a Group III nitride compound semiconductor.

When the crystal orientation of a Group III nitride compound semiconductor layer to be formed on a substrate can be predicted, masking in the form of stripes perpendicular to the a-plane ({11–20} plane) or the m-plane ({1–100} plane) of the Group III nitride compound semiconductor layer is favorable. The aforementioned mask patterns may be island-like or grid-like or may assume other forms. The front of lateral epitaxial growth may be perpendicular or oblique to the surface of a substrate. In order for the a-plane; i.e., the (11–20) plane, of a Group III nitride compound semiconductor layer to become the front of lateral epitaxial growth, the lateral direction of stripes must, for example, be perpendicular to the m-plane; i.e., the (1–100) plane, of the Group III nitride compound semiconductor layer. For example, when the surface of a substrate is the a-plane or the c-plane of sapphire, the m-plane of sapphire usually matches the a-plane of a Group III nitride compound semiconductor layer formed on the substrate. Thus, stripe is performed according to the arrangement of the planes. In the case of a dot-like, grid-like, or island-like etching, planes that define an outline (sidewalls) are preferably {11–20} planes.

A first and a second masks may be formed of at least one of a single-layer and a multi-layer film formed from a polycrystalline semiconductor such as polycrystalline silicon or a polycrystalline nitride semiconductor; an oxide or a nitride, such as silicon oxide ($SiO_x$), silicon nitride ($SiN_x$), titanium oxide ($TiO_x$), or zirconium oxide ($ZrO_x$); or a metal of high melting point, such as titanium (Ti) or tungsten (W), although materials are restricted owing to a growth space ensuring material. When a compound used to form the growth space ensuring material is silicon oxide ($SiO_x$), the first and the second mask may preferably be made of other compounds which cannot be removed in a process for removing $SiO_x$. When a compound used to form the growth space ensuring material is silicon oxide ($SiO_x$), etching using buffered HF can be employed to remove the compound. So silicon nitride ($SiN_x$) not etched by buffered HF may preferably be used to form the first and the second mask. The film may be formed through any known method, such as a vapor-growth method (e.g., deposition, sputtering, or CVD). Besides the above mentioned dielectrics, a single-element metal, an alloy, a compound such as metal oxide, a mixture, and an alloy may be employed as the growth space ensuring material.

A semiconductor device, such as an FET or a light-emitting device, can be formed on the above-described Group III nitride compound semiconductor having regions where threading dislocation is suppressed, throughout the entire region or mainly on the regions where threading dislocation is suppressed. In the case of a light-emitting device, a light-emitting layer may use a multi-quantum well (MQW) structure, a single-quantum well (SQW) structure, a homo-structure, a single-hetero-structure, or a double-hetero-structure, or may be formed by means of, for example, a pin junction or a pn junction.

Figure 1H:
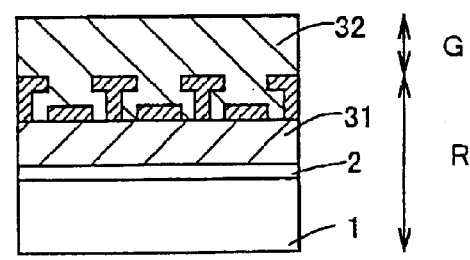

The aforementioned Group III nitride compound semiconductor layer in which threading dislocations are reduced may function as a Group III nitride compound semiconductor substrate (region G in FIG. 1H) by, for example, removing the portion comprising the substrate 1, the buffer layer 2, the first Group III nitride compound semiconductor layer 31 and the first and the second masks 41m and 42m (region R in FIG. 1H). A Group III nitride compound semiconductor device may be formed on the resultant semiconductor substrate. The substrate may be employed for forming a larger Group III nitride compound semiconductor crystal. Removal of the substrate 1, the buffer layer 2, the layer 31, and the mask 4 may be carried out through any technique, such as mechanochemical polishing.

Embodiments of the present invention in which light-emitting devices are produced will next be described. The present invention is not limited to the embodiments described below. The present invention discloses a method for fabricating a Group III nitride compound semiconductor applicable to fabrication of any device.

The Group III nitride compound semiconductor of the present invention was produced through metal-organic vapor phase epitaxy (hereinafter called "MOVPE"). The following gasses were employed: ammonia ($NH_3$), carrier gas ($H_2$ or $N_2$), trimethylgallium ($Ga(CH_3)_3$, hereinafter called "TMG"), trimethylaluminum ($Al(CH_3)_3$, hereinafter called "TMA"), trimethylindium ($In(CH_3)_3$, hereinafter called "TMI"), and cyclopentadienylmagnesium ($Mg(C_5H_5)_2$, hereinafter called "$Cp_2Mg$").

First Embodiment

In the present embodiment, a buffer layer 2 and a Group III nitride compound semiconductor layer 31 as shown in FIGS. 1A–1H are employed. A monocrystalline sapphire substrate 1 containing an a-plane as a primary crystal plane was cleaned through organic cleaning and heat treatment. The temperature of the substrate 1 was lowered to 400° C., and $H_2$ (10 L/min), $NH_3$ (5 L/min), and TMA (20 μmol/min) were fed for about three minutes, to thereby form an AlN buffer layer 2 (thickness: about 40 nm) on the substrate 1. Subsequently, the temperature of the sapphire substrate 1 was maintained at 1000° C., and $H_2$ (20 L/min), $NH_3$ (10 L/min), and TMG (300 μmol/min) were introduced, to thereby form a GaN layer 31 (thickness: about 1 μm). Subsequently, $SiN_x$ was sputtered on the entire surface of the Group III nitride compound semiconductor layer 31, to thereby form a first mask material 41 having a thickness of about 100 nm (FIG. 1A). Then it was patterned in a stripe pattern each having a width of 5 μm at an interval of 5 μm through photolithography (FIG. 1B). Here the longitudinal direction of stripes is <1–100> direction of the GaN layer 31. Accordingly, a first mask 41m made of $SiN_x$ was obtained.

Subsequently, 500 nm in thickness of $SiO_2$ growth space ensuring material 5 was formed on the entire surface of the wafer by EB method (FIG. 1C). Then the $SiO_2$ growth space ensuring material 5 was removed at 1 μm width of central portion of each 5 μm width of interval where the first mask material 41m was not formed by employing photolithography. As a result, the GaN layer 31 was exposed at 1 μm in width of central portion of each stripe-shaped interval having a width of 5 μm where the first mask material 41m was not formed (FIG. 1D).

Subsequently, $SiN_x$ was formed on the entire surface of the wafer through sputtering, and 100 nm in thickness of second mask material 42 was obtained (FIG. 1E). At this time, a "limb" was formed and the second mask material 42 was contacted to 1 μm in width of the exposed GaN layer 31. Then the mask material 42 was patterned in a stripe pattern each having a width of 5 μm at an interval of 5 μm through photolithography. Here the longitudinal direction of stripes was matched with <1–100> direction of the GaN layer 31, and the second mask material 42 was not formed on the upper portion of the first mask 41m. That is, the growth space ensuring material 5s made of $SiO_2$ exists but the second mask 42m does not exist on the upper portion where the first mask 41m was formed while both the growth space ensuring material 5s and the second mask 42m exist on the upper portion where the first mask 41m was not formed. On the upper portion of the GaN layer 31 where neither the mask 41m nor the $SiO_2$ growth space ensuring material 5s exists, the second mask 42m was formed. Accordingly, the second mask 42m having the limb made of $SiN_x$ was obtained (FIG. 1F).

Subsequently, etching using buffered HF was employed to remove the growth space ensuring material 5s made of $SiO_2$. Accordingly, an "epitaxial growth space" surrounded by the first mask 41m and the second mask 42m was obtained on the upper portion of the GaN layer 31.

Subsequently, the temperature of the sapphire substrate 1 was maintained at 1150 20 C., and $H_2$ (20 L/min), $NH_3$ (10 L/min), and TMG (5 μmol/min) were introduced, to thereby grow a GaN layer 32 through vertical and lateral epitaxial growth. Accordingly, the epitaxial growth space formed on the upper portion of the GaN layer 31 and surrounded by the first mask 41m and the second mask 42m was filled and a region G of the GaN layer 32 with remarkably little threading dislocations was obtained over the second mask 42m.

Figure 2A:
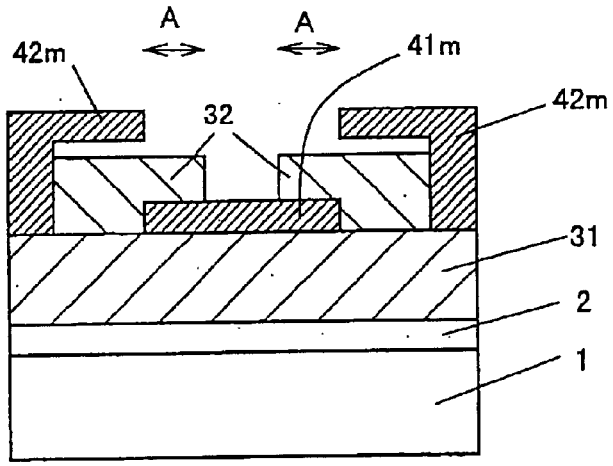
FIGS. 2A–2B are a series of cross-sectional views showing the process of epitaxial growth in the steps of fabricating a Group III nitride compound semiconductor according to the first embodiment of the present invention.
Figure 2B:
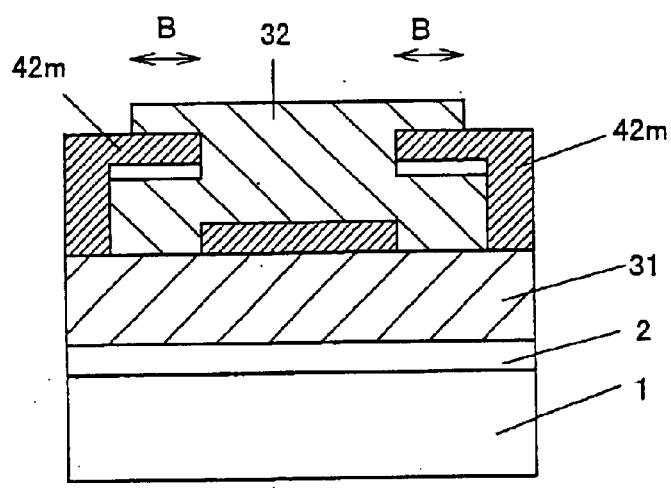

FIGS. 2A–2B illustrate the process shown from FIG. 1G to FIG. 1H. The GaN layer 32 grew in vertical direction from the portion where neither the first mask 41m nor the second mask 42m was formed. When the GaN layer 32 grows to have thickness larger than that of the first mask 41m, the GaN layer 32 starts to grown in lateral direction to cover the first mask 41m (a portion represented by A in FIG. 2A).

Then, because the second mask 42m is not formed on the upper portion of the first mask 41m, the GaN layer starts to grow in vertical direction. On the contrary, because the second mask 42m is formed like eaves on the upper portion of the GaN layer 31 on which the first mask 41m is not formed, growth of the GaN layer 32 stops there. Threading dislocations propagated along with growth of the GaN layer 32 in vertical direction also stop there because they never propagates in lateral direction.

The GaN layer 32 grows in vertical direction on the upper portion of the first mask 41m such that the GaN layer 32 penetrates the region where the second mask 42m is not formed. When height of the GaN layer 32 becomes larger than that of the second mask 42m, it begins to grown in lateral direction and covers the upper surface of the second mask 42m (a region represented by B in FIG. 2B). Even when some of threading dislocations reach the upper portion of the first mask 41m, the second lateral growth of the GaN layer 32 may further reduce the density of the threading dislocations.

Accordingly, the GaN layer 32 covers the entire surface of the second mask 42m through its vertical and lateral growth, and further grows in vertical direction. As a result, threading dislocations of the GaN layer 32 formed at the upper portion of the second mask 42m may be remarkably reduced.

Modified Embodiment

Figure 3:
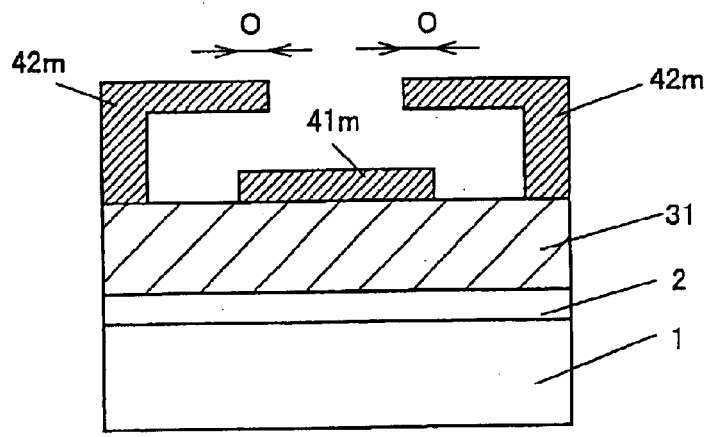
FIG. 3 is a cross-sectional view showing a modified embodiment.

In the above embodiment, the first mask 41m and the second mask 42m are formed so as not to overlap with each other when the wafer is seen in the vertical direction from its top. Alternatively, an overlapped region represented by O as shown in FIG. 3, that is, the first mask 41m exists in the lower portion of the overlapped region and the second mask 42m exists in the upper portion thereof, can be formed. In the above embodiment, the limb of the second mask 42 was formed on the GaN layer 31 in stripe shape each having a width of 1 μm. Alternatively, a limb may be formed on the first mask 41m, and alternatively, the limb in a pillar shape may be formed on both the GaN layer 32 and the first mask 41m. Such limbs all depend on the design of the growth space of the GaN layer 32, and the second mask 42m may have a limb formed in an arbitrary shape according to the design of the growth space of the GaN layer 32.

Second Embodiment

Figure 4:
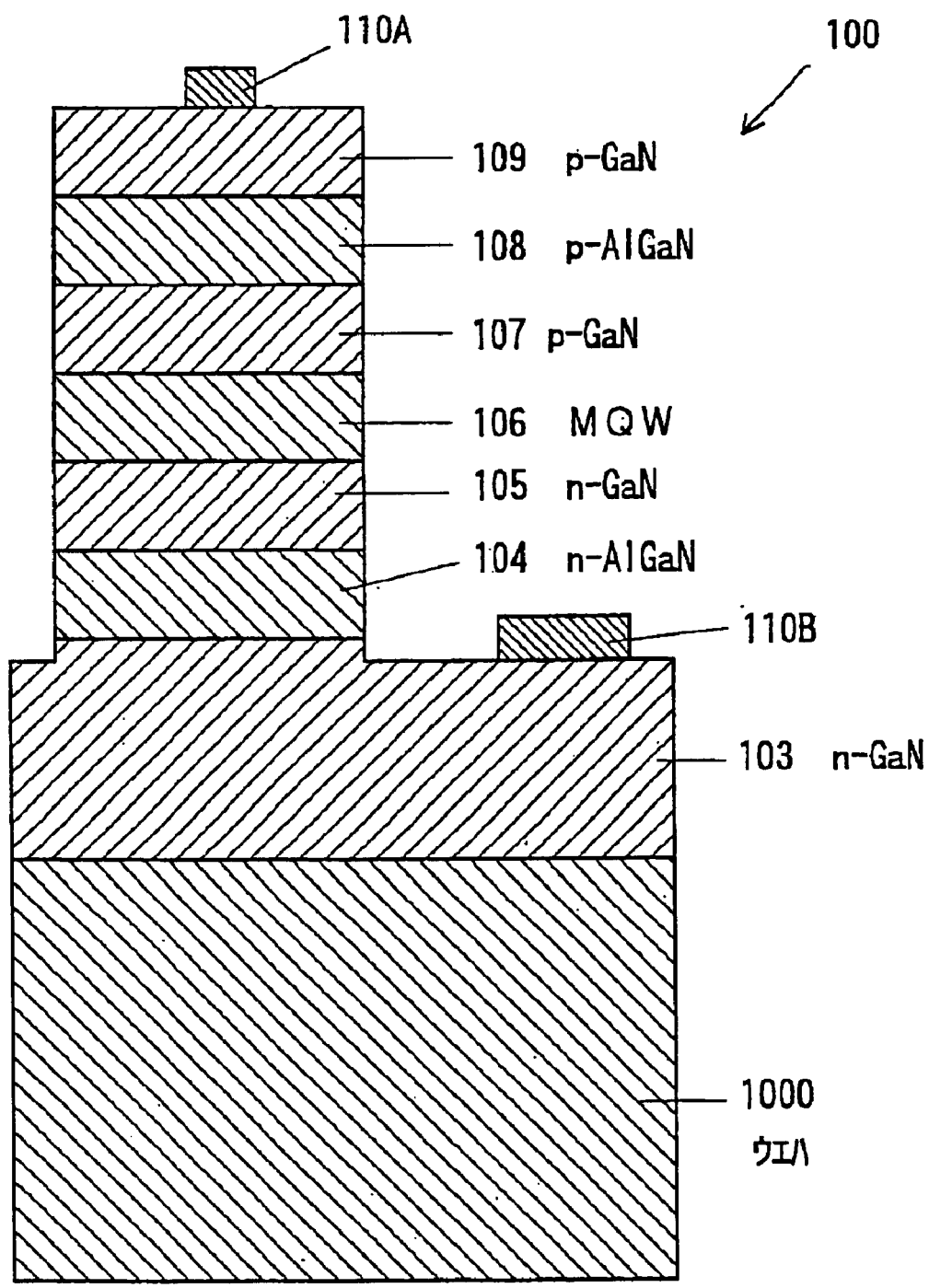
FIG. 4 is a cross-sectional view showing the structure of the Group III nitride compound semiconductor light-emitting device according to the second embodiment of the present invention.

On a wafer formed in a manner similar to that of the first embodiment, a laser diode (LD) 1100 shown in FIG. 4 was formed in the following manner. Notably, in formation of the GaN layer 32, silane ($SiH_4$) was introduced so as to form a silicon (Si)-doped n-type GaN layer serving as the GaN layer 32. For the sake of simplified illustration, the drawing merely illustrates a wafer 1000 (a region R in FIG. 1H) inclusively represent the sapphire substrate 1, the buffer layer 2, the GaN layer 31 and a portion of the GaN layer 32 which exists at the same level as the masks 41m and 42m, and GaN layer 103 (a region G in FIG. 1H) inclusively represent the other portion of the GaN layer 32.

A wafer 1000 which includes a sapphire substrate 1, an AlN buffer layer 2, the GaN layer 31, and a portion of the GaN layer 32 which exists at the same level as the masks 41m and 42m and the n-GaN layer 103 are formed. Successively, on the n-GaN layer 103, a silicon (Si)-doped $Al_{0.08}Ga_{0.92}N$ n-cladding layer 104, a silicon (Si)-doped GaN n-guide layer 105, an MQW-structured light-emitting layer 106, a magnesium (Mg)-doped GaN p-guide layer 107, a magnesium (Mg)-doped $Al_{0.08}Ga_{0.92}N$ p-cladding layer 108, and a magnesium (Mg)-doped GaN p-contact layer 109 were formed. Subsequently, an electrode 110A of gold (Au) was formed on the p-contact layer 109. Etching was partially performed until the n-type GaN layer 103 was exposed. On the exposed GaN layer 103, an electrode 110B of aluminum (Al) was formed. The thus-formed laser diode (LD) 100 exhibited significant improvement of service life and light-emitting efficiency.

Third Embodiment

Figure 5:
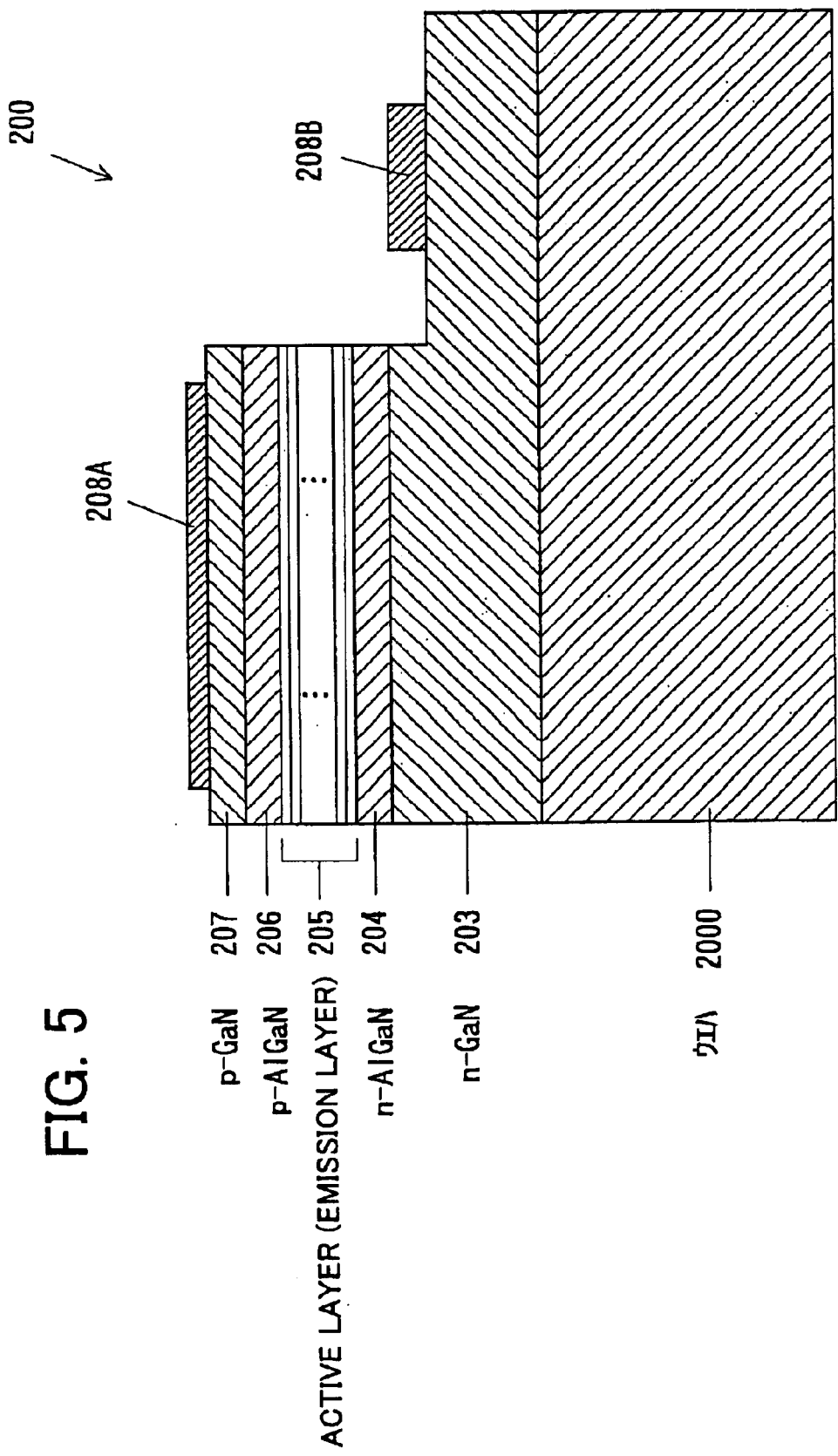
FIG. 5 is a cross-sectional view showing the structure of the Group III nitride compound semiconductor light-emitting device according to the third embodiment of the present invention.
Figure 6:
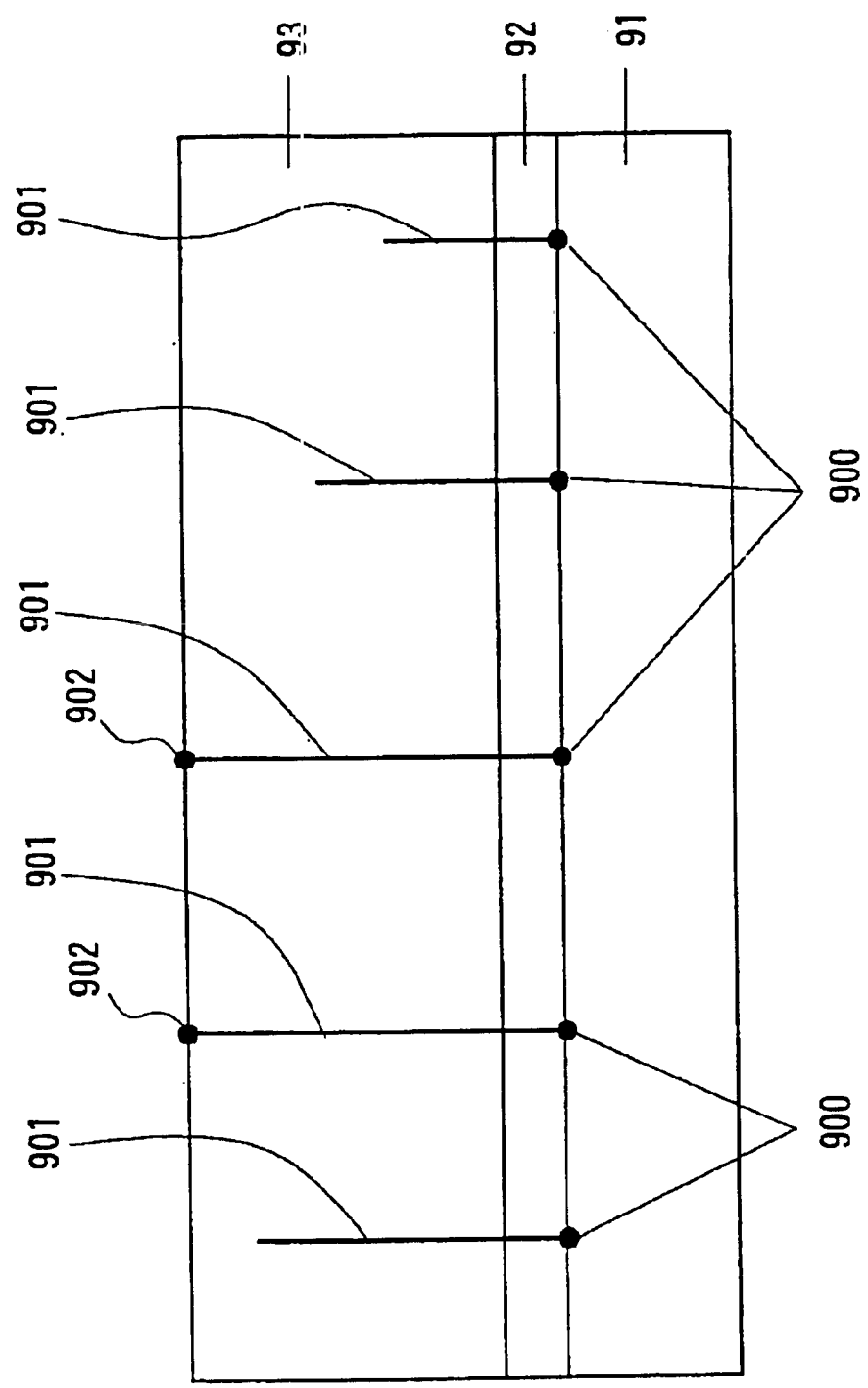
FIG. 6 is a cross-sectional view showing threading dislocations propagating in a Group III nitride compound semiconductor.

On a wafer formed in a manner similar to that of the second embodiment, a light-emitting diode (LED) 200 shown in FIG. 5 was formed in the following manner. For the sake of simplified illustration, the drawing merely illustrates a wafer 2000 (a region R in FIG. 1H) to inclusively represent the sapphire substrate 1, the buffer layer 2, the GaN layer 31 and a portion of the. GaN 32 which exists at the same level as the masks 41m and 42m, and a GaN layer 203 (a region G in FIG. 1H) to inclusively represent the other portion of the GaN layer 32.

A wafer 2000 which includes a sapphire substrate 1, an AlN buffer layer 2, the GaN layer 31 and a portion of the GaN layer 32 which exists at the same level as the masks 41m and 42m, and the n-GaN layer 203 are formed. Successively, on the n-GaN layer 203, a silicon (Si)-doped $Al_{0.08}Ga_{0.92}N$ n-cladding layer 204, a light-emitting layer 205, a magnesium (Mg)-doped $Al_{0.08}Ga_{0.92}N$ p-cladding layer 206, and a magnesium (Mg)-doped GaN p-contact layer 207 were formed. Subsequently, an electrode 208A of gold (Au) was formed on the p-contact layer 207. Etching was partially performed until the n-type GaN layer 203 was exposed. On the exposed GaN layer 203, an electrode 208B of aluminum (Al) was formed. The thus-formed light-emitting diode (LED) 200 exhibited significant improvement of service life and light-emitting efficiency.

While the present invention has been described with reference to the above embodiments as the most practical and optimum ones, the present invention is not limited thereto, but may be modified as appropriate without departing from the spirit of the invention.

What is claimed is:

1. A method for fabricating a Group III nitride compound semiconductor which forms a Group III nitride compound semiconductor layer with suppressed threading dislocations through lateral epitaxial growth, comprising:

a first mask forming process in which a first mask, is formed in a shape of, dot, stripe, or grid, on a layer which serves as an underlying layer, a growth space ensuring process in which a growth space ensuring material is formed on the first mask in order to ensure a growth space for growing said Group III nitride compound semiconductor epitaxially;

a process of forming a second mask in a grid or mesh pattern on the underlying layer;

a process of removing the growth space ensuring material formed in the growth space ensuring process; and an epitaxial growing process in which said Group III nitride compound semiconductor is formed in said growth space through vertical and lateral epitaxial growth, wherein said masks are formed so that the entire surface of said underlying layer is covered by said first mask and said second mask when said underlying layer is seen in a vertical direction from its top.

2. A method for fabricating a Group III nitride compound semiconductor according to claim 1, in which said second mask forming process comprises:

a process in which a portion of said growth space ensuring material formed in said growth space ensuring process is removed and at least one of a portion of said first mask and a portion of said underlying layer is exposed;

a process in which materials for forming said second mask is formed on the entire surface of said growth space ensuring material so that said second mask are connected to at least one of an exposed surface of the first mask and an exposed surface of said underlying layer, and a process in which a portion of said second mask material is removed and a portion of said growth space ensuring material, which is formed in said growth space existing at a region comprising said first mask at a lower portion thereof, is exposed.

3. A method for fabricating a Group III nitride compound semiconductor according to claim 1, wherein an uppermost layer in said underlying layer and said Group III nitride compound semiconductor have the same composition.

4. A method for fabricating a Group III nitride compound semiconductor according to claim 2, wherein an uppermost layer in said underlying layer and said Group III nitride compound semiconductor have the same composition.

5. A Group III nitride compound semiconductor device, which is formed on said a Group III nitride compound semiconductor layer produced through a method for fabricating a Group III nitride compound semiconductor as recited in connection with claim 1.

6. A Group III nitride compound semiconductor device, which is formed on said a Group III nitride compound semiconductor layer produced through a method for fabricating a Group III nitride compound semiconductor as recited in connection with claim 2.

7. A Group III nitride compound semiconductor device, which is formed on said a Group III nitride compound semiconductor layer produced through a method for fabricating a Group III nitride compound semiconductor as recited in connection with claim 3.

8. A Group III nitride compound semiconductor light-emitting device, which is produced by depositing a Group III nitride compound semiconductor layer with a different composition on said Group III nitride compound semiconductor layer produced through a method for fabricating a Group III nitride compound semiconductor as recited in connection with claim 1.

9. A Group III nitride compound semiconductor light-emitting device, which is produced by depositing a Group III nitride compound semiconductor layer with a different composition on said Group III nitride compound semiconductor layer produced through a method for fabricating a Group III nitride compound semiconductor as recited in connection with claim 2.

10. A Group III nitride compound semiconductor light-emitting device, which is produced by depositing a Group III nitride compound semiconductor layer with a different composition on said Group III nitride compound semiconductor layer produced through a method for fabricating a Group III nitride compound semiconductor as recited in connection with claim 3.

11. A method for fabricating a Group III nitride compound semiconductor substrate, which comprises a method for fabricating a Group III nitride compound semiconductor as recited in connection with claim 1, and removing substantially entire downward portions from the second mask.

12. A method for fabricating a Group III nitride compound semiconductor substrate, which comprises a method for fabricating a Group III nitride compound semiconductor as recited in connection with claim 2, and removing substantially entire downward portions from the second mask.

13. A method for fabricating a Group III nitride compound semiconductor substrate, which comprises a method for fabricating a Group III nitride compound semiconductor as recited in connection with claim 3, and removing substantially entire downward portions from the second mask.

* * * * *

UNITED STATES PATENT AND TRADEMARK OFFICE
CERTIFICATE OF CORRECTION

PATENT NO. : 6,844,246 B2 Page 1 of 1
APPLICATION NO. : 10/472261
DATED : January 18, 2005
INVENTOR(S) : Seiji Nagai et al.

It is certified that error appears in the above-identified patent and that said Letters Patent is hereby corrected as shown below:

Column 13, line 19 delete "mask," and insert --mask--; after "formed in" insert --an island pattern having--; line 20, delete "of, dot, stripe, or grid," and insert --of a dot, a stripe, or a grid--.

Please correct claim 2 as follows:

Column 12, line 47, delete "is" and insert --are--.

Signed and Sealed this

Fourth Day of September, 2007

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 6,844,246 B2 |
| APPLICATION NO. | : 10/472261 |
| DATED | : January 18, 2005 |
| INVENTOR(S) | : Seiji Nagai et al. |

It is certified that error appears in the above-identified patent and that said Letters Patent is hereby corrected as shown below:

Column 13, line 19 delete "mask," and insert --mask--; after "formed in" insert --an island pattern having--; line 20, delete "of, dot, stripe, or grid," and insert --of a dot, a stripe, or a grid--.

Column 13, line 47, delete "is" and insert --are--.

Signed and Sealed this

Eighteenth Day of September, 2007

JON W. DUDAS
*Director of the United States Patent and Trademark Office*